United States Patent [19]

Nagano

[11] 4,059,481
[45] Nov. 22, 1977

[54] METHOD OF MAKING AN INTAGLIO HALFTONE GRAVURE PRINTING PLATE

[75] Inventor: Katsusuke Nagano, Mitaka, Japan

[73] Assignee: Dai Nippon Insatsu Kabushiki Kaisha, Tokyo, Japan

[21] Appl. No.: 704,405

[22] Filed: July 12, 1976

[30] Foreign Application Priority Data

July 14, 1975 Japan .................................. 50-85993
Mar. 22, 1976 Japan .................................. 51-31011

[51] Int. Cl.² ................................................ G03F 7/02
[52] U.S. Cl. ................................. 156/660; 96/36.3; 96/37; 96/38; 96/45; 101/170; 156/905
[58] Field of Search .................. 156/14, 18, 654, 660, 156/659, 905; 252/79.1, 79.2, 79.4; 96/36.3, 38, 45, 37, 33; 101/170

[56] References Cited

U.S. PATENT DOCUMENTS

| | | | |
|---|---|---|---|
| 2,060,640 | 11/1936 | Shaw | 96/45 |
| 2,480,400 | 8/1949 | Dultgen | 96/45 |
| 2,731,346 | 1/1956 | Gresham | 96/45 |
| 3,325,285 | 6/1967 | Harris et al. | 96/38 |
| 3,600,244 | 8/1971 | Wegener | 252/79.1 |
| 3,650,957 | 3/1972 | Shipley et al. | 252/79.1 |
| 3,689,417 | 9/1971 | Oikawa et al. | 156/14 |
| 3,752,073 | 8/1973 | Lorber | 96/33 |

*Primary Examiner*—Charles E. Van Horn
*Assistant Examiner*—Jerome W. Massie
*Attorney, Agent, or Firm*—Spensley, Horn and Lubitz

[57] ABSTRACT

An intaglio halftone gravure printing plate is made by contact-printing onto a sensitized carbon tissue a contact screen including a grid-like arrangement of minute dark dots each having the shape of a square rounded off at the four corners with the peripheries vignetted and having densitites tapering from a maximum value of 3.0 at the center to a minimum value of 0.1 at the periphery, contact-printing a halftone positive onto the carbon tissue, contact-printing a light diffusion sheet and the halftone positive combinedly onto the carbon tissue, and developing the treated carbon tissue on a printing plate for subsequent etching of the cylinder.

12 Claims, 6 Drawing Figures

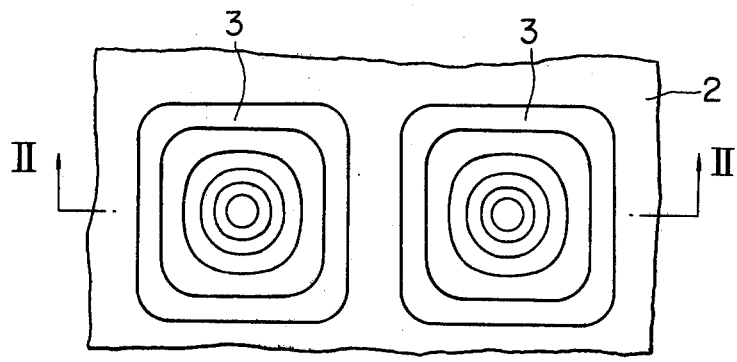
F I G. 1
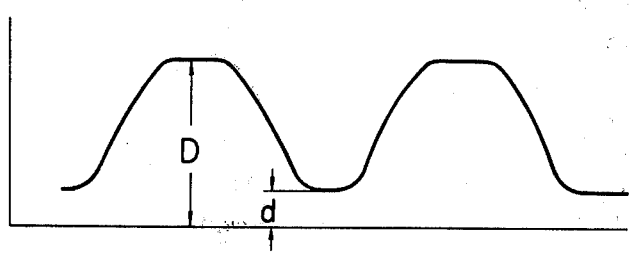
F I G. 2
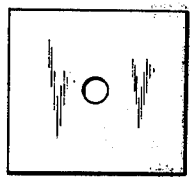
F I G. 3
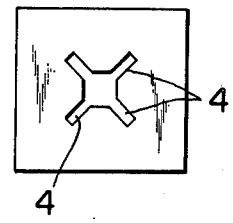
F I G. 4
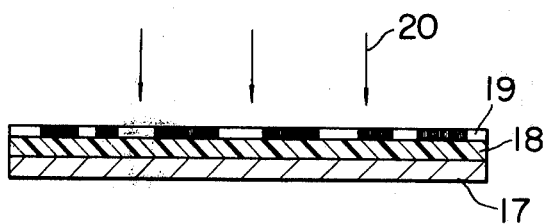
F I G. 6

METHOD OF MAKING AN INTAGLIO HALFTONE GRAVURE PRINTING PLATE

BACKGROUND OF THE INVENTION

This invention relates to a method of making intaglio halftone gravure printing plates having improved tone reproducibility.

In offset printing and relief printing, the tone of an original is reproduced in accordance with differences in area of halftone dots.

On the other hand, in gravure printing, the areas of halftone dots are, in general, the same, and the shapes thereof are square. However, the dots or cells in the printing surface are different in depth, and the depth of each dot or cell determines the amount of ink to be carried therein, that is, the amount of ink carried in each dot is proportional to the depth thereof, whereby the tone of an original is reproduced in accordance with the variations in amount of ink carried in the dots. This gravure printing is well known in the art as conventional gravure printing. In addition, well known in the art is another kind of gravure printing in which the tone of an original is reproduced by both the depth and the area of halftone dots. This has been provided in order to prevent variation of tone and to improve durability of the printing plate, and is called intaglio halftone gravure printing.

An ordinary method of making a printing plate for the gravure printing is the so-called "Dultgen process" in which a continuous-tone positive and a halftone positive are employed. In this method, a sensitized carbon tissue is exposed through the halftone positive, and the continuous-tone positive is printed on the non-exposure areas of the carbon tissue thus exposed. The carbon tissue thus treated is applied onto a printing plate or cylinder, which is subjected to etching after developing of the carbon tissue.

This process is advantageous in stability in making the printing surface, but is disadvantageous in that the size of the continuous-tone positive must be exactly the same as that of the halftone positive, which means that the method is relatively intricate and is difficult from the technical viewpoint. Furthermore, in this known method, light tone areas of the original, especially the light tone areas having halftone dot percentages of the order of 5 to 8% are not reproduced, and therefore the printed matter appears rough, that is, it lacks smooth tone in its entirety.

SUMMARY OF THE INVENTION

Accordingly, an object of this invention is to eliminate the above mentioned difficulties accompanying the conventional gravure method of making an intaglio halftone gravure printing plate.

Another object of this invention is to provide a method of making a halftone gravure printing plate wherein the printing plate is prepared with the use of a halftone positive without using a continuous-tone positive, whereby the method is made simple.

Still another object of this invention is to provide a method of making a halftone gravure printing plate by the use of which printed images are given excellently reproduced smooth tones.

A further object of this invention is to enable complete reproduction of light tone areas of an original on the printed matter.

A still further object of this invention is to provide a method of making a haltone gravure printing plate which enables stable etching treatment, whereby the quality of reproduced tones is kept substantially constant.

According to this invention, briefly summarized, there is provided a method of making an intaglio halftone gravure printing plate comprising the steps of contact-printing onto a sensitized carbon tissue a contact screen including a grid-like arrangement of minute dark dots each having the shape of a square rounded off at the four corners with a vignetted periphery and having densities tapering from a maximum value of 3.0 at the central part to a minimum value of 0.1 at the periphery; contact-printing a halftone positive onto the carbon tissue; superposing a light diffusion sheet and the halftone positive on the carbon tissue in this order and contact-printing the light diffusion sheet and halftone positive combinedly onto the carbon tissue; said steps being carried out in any desired order; applying the thus treated carbon tissue to a printing plate to develop the tissue thereon; and etching the printing plate to obtain the halftone gravure printing plate.

BRIEF DESCRIPTION OF THE DRAWINGS

In the drawings:

FIG. 1 is a greatly enlarged, fragmentary schematic view showing part of a contact screen to be used in this invention;

FIG. 2 is a diagram showing how the density of the contact screen changes along the line II—II in FIG. 1;

FIG. 3 is a view illustrative of the shape of a stop used in preparing the contact screen shown in FIG. 1;

FIG. 4 is a view showing another stop to be used with the above stop;

FIG. 6 is a sectional view showing how a light mask used in this invention is made.

DETAILED DESCRIPTION OF THE INVENTION

Figure 5:
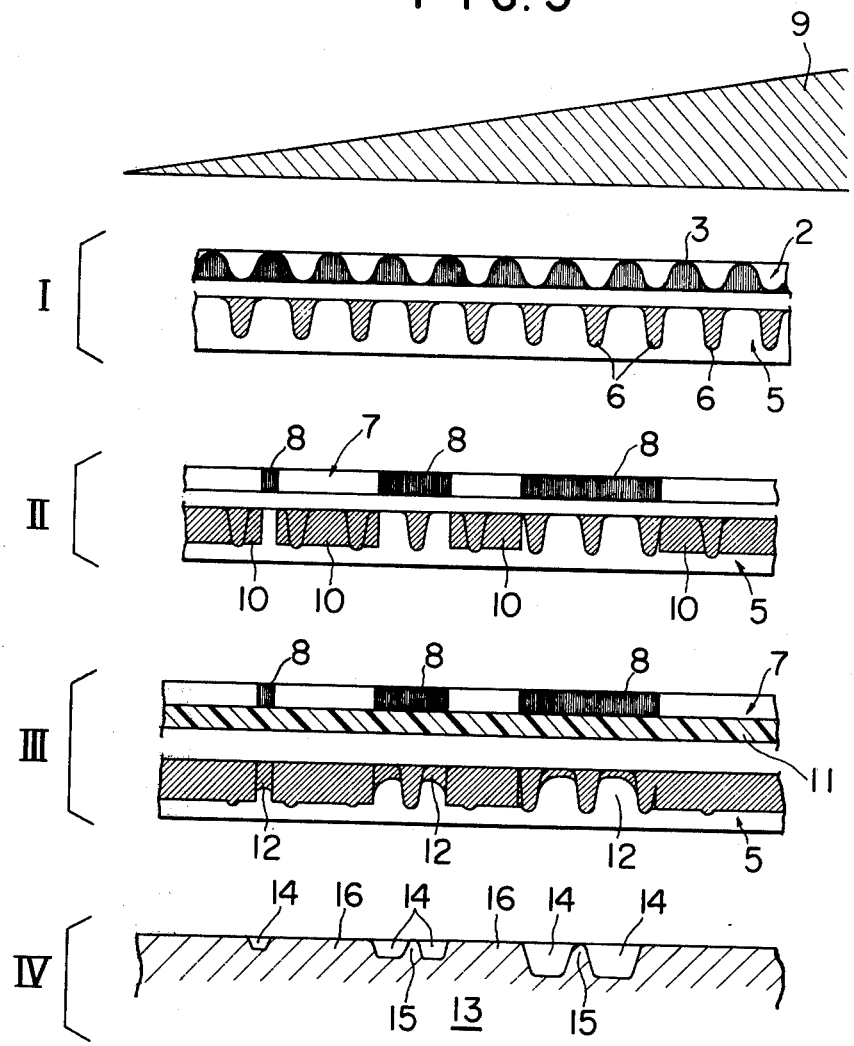
FIG. 5 is a schematic diagram showing in sequence the manner of treatment of a carbon tissue as well as the density of an original and the condition of an etched printing surface.

In the method of making a halftone gravure printing plate according to this invention, a carbon tissue employed in the conventional gravure printing plate making process or in the halftone gravure printing plate making process can be used.

In order to sensitize the carbon tissue, it is immersed in a several-percent solution of potassium bichromate, and is then dried in a dark room. The carbon tissue thus sensitized is subjected to the following three steps of treatment in any desired order.

In the first one of the three steps, which need not necessarily be carried out first, a special contact screen 2 as shown in FIGS. 1 and 2 is used. This contact screen 2 has a number of minute dark dots 3. As is apparent from FIG. 2, the density D of the central part of each dot 3 is as high as 3.0 and the density of the dot 3 tapers or decreases gradually toward the periphery of the dot to a value d which is normally 0.1. The contour line of each dot 3 is in the form of a circle at the central part and changes toward the periphery into the shape of a square the corners of which are rounded off as shown. It will be noted that the contour lines forming each dot varies gradually from a circle to a square. It is preferable that this contact screen have a grid-like arrangement of lines of the order of 100 to 350 lines/inch, composed of the minute dots.

This special contact screen 2 can be obtained by subjecting a photo-sensitive film to double exposures with two kinds of stops through a glass screen having a grid composed of a desired number of lines. One of the two kinds of stops is shown in FIG. 3. This stop is in the form of a small circular hole. The other stop is illustrated in FIG. 4. This stop is in the form of an eared stop having four projecting ears 4 at the four corners of a square. The quantity of exposure with the circular stop is 1.5 to 3 times of that with the eared stop.

The contact screen 2 of the above character is contact-printed on the carbon tissue in this step of treatment. More specifically, the contact screen 2 is set in close contact with the sensitized carbon tissue and is then printed on the latter with the use of a known pneumatic printing frame. In this operation, an ordinary light source such as a mercury lamp or an arc lamp can be employed for the exposure.

Through this step of treatment, the carbon tissue is subjected to hardening treatment which is effective to provide so-called lands on the printing surface of the gravure printing plate after all the steps of treatment to be described later have been completed. This step of treatment is schematically illustrated in FIG. 5 and designated by I therein. When the contact screen 2 having dots 3 is contact-printed onto the carbon tissue indicated by numeral 5, the light-exposed areas of the carbon tissue 5 are hardened as shown by numeral 6, and these hardened areas serve for forming the lands on the gravure printing surface.

In the second step of treatment, which need not necessarily be carried out in the second order, to be applied to the sensitized carbon tissue, a halftone positive is contact-printed onto the sensitized carbon tissue. This step is also schematically illustrated in FIG. 5 and designated by II therein. The halftone positive designated by 7 has a number of halftone dots 8 corresponding in size or area to the continuously changing tone of an original 9 shown at the top of FIG. 5. It will be observed from the example shown in FIG. 5 that the number of grid-forming lines, per unit length, formed of the halftone dots 8 is different from the number of the grid-forming lines, per unit length, formed of the dark dots 3 on the contact screen 2. When the halftone positive 7 is contact-printed on the carbon tissue 5, the light-exposed areas thereof are hardened as shown by numerals 10.

In this second step, the halftone positive 7 may be of any type of halftone positive which is employed in making offset printing plates, relief printing plates and gravure printing plates. The contact-printing of the halftone positive is carried out in the same manner as in the case of the above-described first step in which the contact screen is printed.

The third step of treatment applied to the sensitized carbon tissue, which need not necessarily be carried out in the third order, is a treatment in which a light diffusion sheet 11 and the halftone positive 7 are superposed in this order on the carbon tissue 5, and then the carbon tissue 5 is subjected to exposure through the sheet 11 and the positive 7 thus superposed, as schematically shown in FIG. 5 and designated at III therein. The exposure of the carbon tissue is carried out in the same manner as in the case of the above described first and second steps. The light beams passed through the halftone positive 7 are diffused by the light diffusion sheet 11. It will be understood that the quantities of the light beams which have passed through the halftone positive 7 are large for the high light areas of the positive 7, and are small for the shadowy areas of the same. This variation in the light beam transmittivity induces the continuous tone variation with the aid of the above-described light diffusion, whereby the areas of the carbon tissue 5, subjected to the varying diffused light from the diffusion sheet 11, are hardened as designated at 12 in conformity with the continuously changing tone of the original 9, without printing the original itself on the carbon tissue.

In this third step of treatment, from among a number of light diffusion sheets different in light transmittivity from 60 to 90% and in thickness from 50 to 100 $\mu$, a suitable one can be selectively employed depending on the range in density of the halftone positive, the tonal conditions of the original, the developing method, and the etching method. A concrete example of the light diffusion sheet is, for instance, a matted film of synthetic resin, or a diffusion glass.

In the application of the above-described three steps of treatment to the sensitized carbon tissue, the contact-printing of the special contact screen in the first step may be carried out with a quantity of exposure which is almost the same as that in the contact-printing of a halftone positive carried out in the conventional gravure printing process; the contact-printing of the halftone positive in the second step may be carried out with a quantity of exposure which is less than that in the case of the contact-printing in the first step, that is, with a quantity of exposure which is 60 to 90% of that in the contact-printing in the first step; and the contact-printing of the diffusion sheet and the halftone positive in the third step may be conducted with a quantity of exposure which is approximately half of that in the case of contact-printing the contact screen 2, that is, with a quantity of exposure which is of the order of 40 to 60% of the quantity of exposure in the contact-printing in the first step.

The carbon tissue subjected to the above-described three steps of treatment in any desired order is applied to a printing plate or cylinder, and then the plate or cylinder is subjected to developing and etching steps to provide a gravure printing surface of the printing plate or cylinder. This operation can be achieved substantially in the same manner as in the conventional gravure process.

The carbon tissue subjected to the above-described printing steps of treatment is quickly applied onto the surface of the printing plate or cylinder, which may be a cylinder employed in rotary printing presses or a copper plate. The application of the carbon tissue may be accomplished either by a wet method or by a dry method.

After application of the carbon tissue, portions thereof not exposed to light are washed away by hot water, and insoluble hardened portions thereof are left as they are on the printing surface. The surface is further washed with water, and is dried. Then, the printing surface is subjected to etching with ferric chloride solution. This etching is carried out with five to seven kinds of ferric chloride solutions different in specific gravity, or with only one kind of ferric chloride solution. As a result, a printing plate or cylinder 13 having dots or ink-carrying cells 14 is formed as shown at IV in FIG. 5. It will be observed that between the two closely adjoining cells 14 is formed a small land 15 which is far narrower than lands 16 serving for enabling retention of ink in the cells 14 and that the two closely adjoining cells 14 look like a united single cell.

After being etched, the printing surface is plated with chromium or nickel to improve its durability.

In order to stabilize the etched portions of the printing surface and to improve the reproducibility of the light tone areas of the original, it is advisable to add the following ingredients to the ferric chloride solution. One possibility is the addition of inorganic iron salts such as ferrous sulfate, ferric sulfate and ferric nitrate. These iron salts can be added singly or in combination of at least two of them. Another possibility is the addition of a mixture of alkaline solutions of at least one of amino acids such as phenylalanine, alanine and glycine, and of at least one of inorganic copper salts such as copper sulfate, cupric chloride and cupric nitrate. There is a further possibility of using the combination of at least one of the above mentioned inorganic iron salts and the above mentioned mixture. In any of the above three cases, the quantity of the ingredients to be added should preferably be between 7 to 8%, by weight, of the amount of the ferric chloride solution.

The etching of the printing surface may be manually achieved; however, it can be more effectively achieved by a method in which the etching liquid is physically permeated into the printing surface for instance, by means of a roller. In this method, an automatic etching machine available on market, for instance, as "WALTER WULLY AUTOMATIC ETCHING-MACHINE GRAVURPILOP" (made by Maschinenfabrik Kaspar Walter in West Germany) or "GRAVOMASTER CONTROMAT" (made by Max Datwyler and Company in Switzerland) can be employed.

If the etching liquid and the etching machine described above are employed for etching the printing surface, the period of time required for the etching operation can be reduced, and even if the depth of the dots is small, the amounts of ink contained in the dots can be held therein by the effect of side etching on the dots. Accordingly, no breaking of lands and no infiltration of the etching liquid below the resists formed occurs, and dots having a dot percent of 5 to 8 can be readily and stably reproduced.

From the above description, it is apparent that the first step of treatment, which need not necessarily be carried out at first, is mainly for providing the lands defining the ink-retaining cells in the printing surface. According to this first step, the dots 3 of the contact screen 2 have the gradually varying density and contour lines as described hereinbefore, so that, unlike the case where a conventional gravure screen is employed for providing lands, the dots or ink-carrying cells to be formed in the printing surface do not have sharp corners and edges and are relatively round, which results in improved ink transfer from the printing surface to the printing material.

It is to be noted that in the second step the area of each dot or ink-carrying cell 14 is determined, while in the third step the variation in the area of the halftone dots 8 in the halftone positive 7 used in combination with the diffusion sheet 11 causes the carbon tissue 5 to be exposed to smoothed continuous-tone image which is almost identical to that of the original, whereby roughness in the printed matter disappears.

According to this invention, a light mask of the character to be described hereinbelow may be used in the third step of treatment described hereinbefore in order to further improve reproducibility of light tone areas. As was pointed out hereinbefore, light tone areas of an original, especially light tone areas having halftone dot percentages of the order of 5 to 8%, are usually not reproduced completely. This is because the depth and area of each halftone dot tend to be smaller than they should actually be, in the range of the above percentages.

The light mask used in this invention is a vignetted negative film wherein its portions corresponding to portions of a corresponding halftone positive having halftone dot percentages of and below about 5% have a maximum density of 0.6, and its portions corresponding to portions of the halftone positive having halftone dot percentages between 5 and 8% have a continuously varying tone below a density of 0.6, and wherein its portions corresponding to portions of the halftone positive having halftone dot percentages above 8% have a density of zero.

In the third step of treatment of the carbon tissue 5, the light mask of the above character is superposed directly on the carbon tissue 5, and the light diffusion sheet 11 and the halftone positive 7 are superposed on the light mask in this order. Alternately, the superposing order of these three sheets or films may be such that the diffusion sheet, the light mask and halftone positive are superposed in this order on the carbon tissue. Thereafter, contact printing onto the carbon tissue is carried out in the same manner as described hereinbefore in connection with the third step of treatment.

It is to be noted that the light mask which may be used in this invention is different from the light masks which have been used in offset printing for the purpose of preventing formation of halftone dots in light tone areas so that the light tone areas are not reproduced as they are on the printed matter.

In the light mask used in this invention, its portions corresponding to portions of the halftone positive having halftone dot percentages above 8% have a density of zero, whereby the use of this light mask in the third step of treatment of the carbon tissue does not affect the reproducibility of these portions at all, while in the portions of the light mask corresponding to portions of the halftone positive having halftone dot percentages between 5 and 8%, the reproducibility of the tone is improved because of the continuously varying tone below the density of 0.6 in these portions of the light mask.

The light mask used in this invention can be produced from a continuous-tone positive, while it can also be produced from a halftone positive with the use of a diffusion sheet. FIG. 6 illustrates how the light mask is produced. Reference numeral 17 designates a photo-sensitive film from which the light mask is made. The photo-sensitive film 17 may be of any type but it is preferably of a litho-type. On the film 17, a high diffusion sheet 18 and a halftone positive film 19 are superposed in this order, and they are set in a pneumatic printing frame and subjected to exposure as indicated at 20. A white light is preferably used as a light source for the exposure. The diffusion sheet 18 may be selected from diffusion sheets having transmittivities between 30 to 50% and thicknesses between 150 to 250 $\mu$ depending on the condition of the halftone positive to be used and on the condition of the original. The diffusion sheet 18 can be in the form of a matted film of synthetic resin or a diffusion glass. For the halftone positive 19, a halftone positive for use in gravure printing, relief printing or offset printing may be used.

A practical example of making a gravure printing plate is given below.

EXAMPLE

A special contact screen was prepared which was formed with a grid-like arrangement of dark dots of 200 lines/inch, each having the shape of a square rounded off at the four corners with vignetted periphery and having densities tapering from a maximum value of 3.0 at the central part to a minimum value of 0.1 at the peripheral part. The thus prepared contact screen was superposed on a sensitized carbon tissue and printed thereon by exposure. On the thus treated carbon tissue, a halftone positive for offset printing was superposed and contact-printed thereon. Thereafter, a diffusion sheet and the halftone positive for offset printing were superposed on the thus treated carbon tissue in this order, and then they were subjected to exposure for printing on the carbon tissue.

The thus treated carbon tissue was applied onto a gravure printing cylinder for subsequent developing and etching in the well known manner. The printing cylinder thus made was used for printing. It was found that delicate various tones of the original were well reproduced on the printed matter. Especially, the reproducibility of light tone portions of the original of which the halftone dot percentage was between 5 and 8% was good.

On the other hand, the same test as described above was conducted with the additional use, in a manner to be described later, of a vignetted negative as a light mask. This vignetted negative was made by the following procedure.

A matted polyester film of 200-$\mu$ thickness, having a transmittivity of 40% was superposed on a litho-type film sold under the trademark "FUJI LITH FO" by Fuji Shashin Film Seizo Kabushiki Kaisha, Japan, and a halftone positive for offset printing was further superposed on the lith-type film. These three films were set in a pneumatic printing frame and exposed to a white light (6 volts and 20 watts) located at a position at a distance of one meter from the surface of the halftone positive.

The thus exposed litho-type film was developed and fixed in an automatic developing machine for litho-type films with the use of a developing solution for litho-type films, and was made the above mentioned vignetted negative. This vignetted negative had portions of a density of 0.6, at portions corresponding to portions of the halftone negative having halftone dot percentages below about 5%, and portions of zero density, at portions corresponding to portions of the halftone negative having halftone dot percentages above 8%.

In this second test additionally using the vignetted negative, after the contact-printing of the contact screen and the subsequent contact-printing of the halftone positive, the aforementioned vignetted negative, the diffusion sheet and the halftone positive for offset printing were superposed in this order on the twice treated carbon tissue, and then they were subjected to exposure for printing on the carbon tissue. Thereafter, a printing cylinder was made, and as a result of printing with the use of the printing cylinder, it was found that the reproducibility of light tone portions of the original of which the halftone dot percentage was between 5 and 8% was excellent.

A third test was also conducted which is different from the second mentioned test only in that the vignetted negative was superposed on the diffusion sheet, i.e., the order of the vignetted negative and the diffusion sheet in the second mentioned test was exchanged. In this third test, an equally excellent reproducibility as in the second mentioned test was obtained.

As is apparent from the above description, the method of making a screen gravure printing surface according to this invention is superior in reproducibility. Since in the invention the above-described special contact screen is employed in the process, the dots, unlike the dots in the conventional process where a gravure screen is used, are never formed sharp, that is, the dots obtained are relatively rounded and have smooth peripheries. Therefore, deformation of the dots will not be clearly reproduced, and the doctor can be uniformly abutted on the dots of the printing surface. As a result, the printed matter appears smooth throughout its area.

It should be appreciated that halftone positives used in the gravure printing plate making process, the offset printing plate making process, or the relief printing plate making process can be employed in the process according to this invention.

If halftone positives employed in the offset printing plate making process are used in the method of making a halftone gravure printing plate according to the invention, the advantages of the offset printing can be obtained in addition to the advantage of the gravure printing, such as massive feeling. Accordingly, reproducibility of the tone of an original can be improved, and proof printing by the offset printing is made possible.

In addition, in this invention, the printing plate is made by the use of the halftone positive only without using any continuous-tone positive, which leads to one of the merits of the invention, which is that the printing plate making process can be simplified; and since the reproduction of an original depends on both the area and depth of the dots, it is not affected by slight variation in etching which might be caused during the etching step, and therefore tone reproduction can be precisely achieved.

I claim:

1. A method of making an intaglio halftone gravure printing plate comprising the steps of:
    contact-printing onto a sensitized carbon tissue a contact screen including a grid-like arrangement of minute dark dots each having the shape of a square rounded off at the four corners with a vignetted periphery and having densities tapering from a maximum value of 3.0 at the central part to a minimum value of 0.1 at the periphery;
    contact-printing in registration a halftone positive onto the carbon tissue;
    superposing a light diffusion sheet and the halftone positive on the carbon tissue in the order named, and contact-printing in registration the light diffusion sheet and the halftone positive combinedly onto the carbon tissue;
    said steps being carried out in any desired order;
    applying the thus treated carbon tissue to a printing plate to develop the tissue thereon; and
    etching the printing plate to obtain the halftone gravure printing plate.

2. The method of making an intaglio halftone gravure printing plate as claimed in claim 1, further including the step of superposing a light mask in the form of a vignetted negative directly on the carbon tissue before said light diffusion sheet and said halftone positive are superposed on the carbon tissue, and contact-printing in registration the light mask, the light diffusion sheet and the halftone positive onto the carbon tissue, portions of said light mask which correspond to portions of the halftone positive of halftone dot percentages between 5 and 8% having a continuously varying tone below a density of 0.6.

3. The method of making an intaglio halftone gravure printing plate as claimed in claim 1, further including the step of interposing a light mask in the form of a vignetted negative between said light diffusion sheet and said halftone positive on the carbon tissue, and contact-printing the light diffusion sheet, the light mask and the halftone positive superposed in this order onto the carbon tissue, portions of said light mask which correspond to portions of the halftone positive of halftone dot percentages between 5 and 8% having a continuous varying tone below a density of 0.6.

4. The method of making an intaglio halftone gravure printing plate as claimed in claim 2 wherein said light mask has a density of zero in its portions corresponding to portions of the halftone positive of halftone dot percentages above 8%, and has a maximum density of 0.6 in its portions corresponding to portions of the halftone positive of halftone dot percentages of and below about 5%.

5. The method of making an intaglio halftone gravure printing plate as claimed in claim 3 wherein said light mask has a density of zero in its portions corresponding to portions of the halftone positive of halftone dot percentages above 8%, and has a maximum density of 0.6 in its portions corresponding to portions of the halftone positive of halftone dot percentages of and below about 5%.

6. The method of making an intaglio halftone gravure printing plate as claimed in claim 1 wherein said halftone positive is of the type for use in offset printing.

7. The method of making an intaglio halftone gravure printing plate as claimed in claim 1 wherein said diffusion sheet is a matted film of synthetic resin.

8. The method of making an intaglio halftone gravure printing plate as claimed in claim 1 wherein said diffusion sheet is a light diffusion glass.

9. The method of making an intaglio halftone gravure printing plate as claimed in claim 1 wherein the contact-printing of said halftone positive on the carbon tissue is carried out with a quantity of exposure of the order of 60 to 90% of the quantity of exposure for the contact screen printing, and the contact-printing of said diffusion sheet and said halftone positive is carried out with a quantity of exposure of the order of 40 to 60% of the quantity of exposure for the contact screen printing.

10. The method of making an intaglio halftone gravure printing plate as claimed in claim 1 wherein said diffusion sheet has a light transmissivity of between 60 to 90% and a thickness of between 50 to 100 $\mu$.

11. The method of making an intaglio halftone gravure printing plate as claimed in Claim 1 wherein said etching is carried out with a ferric chloride solution consisting essentially of at least one inorganic iron salt selected from the group consisting of ferrous sulfate, ferric sulfate and ferric nitrate.

12. The method of making an intaglio halftone gravure printing plate as claimed in claim 1 wherein said etching is carried out with a ferric chloride solution containing a mixture of alkaline solution of at least one amino acid selected from the group consisting of phenylalanine, alanine and glycine, and of at least one inorganic copper salt selected from the group consisting of copper sulfate, cupric chloride and cupric nitrate.

* * * * *